United States Patent [19]

Turner

[11] Patent Number: 4,486,659
[45] Date of Patent: Dec. 4, 1984

[54] EMISSON-ELECTRON MICROSCOPE

[75] Inventor: David W. Turner, Oxford, England

[73] Assignee: Thor Cryogenics Limited, England

[21] Appl. No.: 420,223

[22] PCT Filed: Jan. 15, 1982

[86] PCT No.: PCT/GB82/00008
§ 371 Date: Sep. 13, 1982
§ 102(e) Date: Sep. 13, 1982

[87] PCT Pub. No.: WO82/02624
PCT Pub. Date: Aug. 5, 1982

[30] Foreign Application Priority Data

Jan. 16, 1981 [GB] United Kingdom ............... 8101364

[51] Int. Cl.$^3$ .................... G01N 23/22; H01J 37/285
[52] U.S. Cl. ................................................. 250/306
[58] Field of Search ............................ 250/306, 307

[56] References Cited

U.S. PATENT DOCUMENTS 3,822,382  7/1974  Koike .
4,096,386  6/1978  Rempfer et al. .

OTHER PUBLICATIONS

Journal of Physics, E. Scientific Instuments, vol. 13, 1980 (London, GB), G. Beamson et al.: "The Collimating and Magnifying Properties of a Superconducting Field Photoelectron Spectometer", pp. 64-66, see page 64, left-hand column, last paragraph, p. 65, left-hand column, last paragraph to p. 66, left-hand column, end of the first paragraph, figure 1, p. 66, pargraph 3 cited in the application.

Instruments and Experimental Techniques, vol. 21, No. 4, part 2, Jul./Aug. 1978 (New York), US), A. V. Gostev et al.: "Universal Instrument for the Investigation of Local and Integral Electron Emission", pp. 1053-1055, see whole document.

Primary Examiner—Alfred E. Smith
Assistant Examiner—Jack I. Berman
Attorney, Agent, or Firm—Beveridge, DeGrandi & Kline

[57] ABSTRACT

An emission-electron microscope comprises an evacuated chamber with a superconducting magnet at one end generating a region of very high field strength. In this region a specimen is mounted and the surface of the specimen is irradiated with photons, typically x-ray or hard ultra-violet, from a source. As a result the specimen emits photo-electrons. The magnetic field is axially symmetrical along the length of the chamber and emitted electrons spiral about the lines of force traveling down the chamber into a region of lower magnetic field controlled by electro-magnet coils. Transverse kinetic energy of the electrons is converted into energy along the lines of force of the magnetic field and the divergence of the magnetic field lines causes electrons to produce on a detector an expanded electron image indicative of the distribution of electron flux across the surface region of the specimen. The emission-electrons may be produced by other stimulation methods, for example neutral atoms or heat (thermal electrons) and arrangements may be provided to permit only electrons of predetermined energy reaching the detector.

4 Claims, 7 Drawing Figures

EMISSON-ELECTRON MICROSCOPE

The present invention relates to an emission-electron microscope.

There are various ways in which a specimen material can be stimulated so as to emit electrons. For example photo-electrons may be emitted from the surface of a specimen irradiated with photons of sufficient energy. Another method of stimulation is to irradiate the specimen with neutral atoms to produce emitted electrons. Also thermal electrons may be emitted when a specimen material is heated.

Throughout the description and claims of this specification, electrons which are emitted from the specimen itself, usually, though not always, as a result of being suitably stimulated, are referred to as "emission electrons".

The present invention is concerned with apparatus, referred to as a microscope, for imaging the surface of an electron emitting specimen usng these emission electrons. The image produced is indicative of the distribution over the imaged surface of the flux of emission electrons.

Considering particularly photo-electrons, the technique of photo-electron spectroscopy is well known and has been used for determining properties of specimens dependent on the ionization energy of atoms in the surface region of the specimen. Well known text books on the technique are "Principles of Ultra Violet Photoelectron Spectroscopy", by J. W. Rabalais, published by Wiley, and "Electron Spectroscopy, Theory Techniques and Applications" Vols. 1–3 Eds. C. R. Brundle and A. D. Baker, Academic Press 1977.

In photo-electron spectroscopy it is known to irradiate a specimen with ultra violet radiation, usually vacuum ultra violet, or alternatively with soft x-rays, to stimulate the specimen to emit photo-electrons. Various techniques are then employed to determine the energy spectrum of the emitted photo-electrons. One problem with photo-electron spectroscopy is that photo-electrons are normally emitted over a solid angle of a full $4\pi$, or $2\pi$ for the plain surface of a solid specimen, so only relatively few enter the aperture of the energy analyser.

One way of improving the flux of photo-electrons entering the electron analyser of the spectrometer involves carrying out the photo-electron experiment in a strong magnetic field. This is described in the journal, Phys. Scr. 16 186, in an article by Beamson, Pearce and Turner entitled "Photo-electron spectroscopy in a strong magnetic field". That article describes a technique of collimating the photo-electron flux using an axially symmetric homogeneous magnetic field. In such an arrangement, electrons emitted form the surface of the specimen at an angle to the direction of the magnetic field are constrained by the field to orbit about the lines of flux of the field and therefore travel with a helical path along the magnetic field direction.

It has also been proposed to carry out photo-electron spectroscopy in an axially symmetric inhomogeneous magnetic field, that is a field in which the flux lines converge or diverge along the axis of the field. It can then be shown that, if the specimen is located in a region of relatively high magnetic field so that photo-electrons emitted thereby travel along the axis of the field into a region of lower field strength, any kinetic energy of the electrons transverse to the direction of the magnetic field is progressively transferred to energy along the field direction as the electron moves into the region of weaker magnetic field. A discussion of this phenomenon is given in the article entitled "The collimating and magnifying properties of a superconducting field photoelectron spectrometer", by Beamson, Peter and Turner, published in the Journal of Physics, J. Phys. E:Sci. Instrum., Vol 13, 1980, page 64.

In that article it is explained that if the ratio between the magnetic field at the specimen and the field at the energy analyser is sufficiently large nearly all the transverse kinetic energy of the emitted electrons has been transferred to longitudinal energy by the time the electrons arrive at the analyser. This greatly facilitates the measurement of electron energy spectra since substantially all electrons emitted from the surface of the specimen can be used in determining the energies.

The above article also suggests that the technique may be employed to provide a magnified image of the electron energy or flux distribution over the surface of the irradiated specimen. Electrons emitted from the surface of the specimen are effectively constrained in their general motion to travel parallel with the lines of flux of the magnetic field so that the spatial distribution of electrons emitted from the specimen surface is reproduced at the analyser with a linear magnification proportional to the square root of the ratio of the magnetic field strength at the specimen to that at the analyser. The above referred article however gives no indication of how a practical device can be built.

According to the present invention, an emission-electron microscope comprises means for generating a magnetic field having a first region at which the field is relatively strong and a second region at which the field is relatively weak and which is inter-connected by lines of flux with the first region, means for locating a specimen to be examined in said first region, the specimen being selected or arranged in use such that electrons are emitted by at least a portion of a surface of said specimen extending in said first region at an angle to said field, said magnetic field generating means being arranged so that the field in said first region is sufficiently strong that electrons emitted by the specimen at angles to the magnetic field are constrained by the field to spiral around the lines of flux of the field, electron detector means including a detector located in said second region, said detector means being arranged to provide an indication of the spatial distribution transversely of the field in said second region of electrons emitted by the specimen and travelling to said second region, thereby to provide a magnified emission-electron image of at least part of said surface portion of the specimen and means for controlling and adjusting the relative strengths of the magnetic fields in the first and second regions to effect adjustment of said image magnification.

In a preferred example, the microscope includes means for stimulating at least said surface portion of the specimen to cause electrons to be emitted by said surface. This means for stimulating may comprise meansfor irradiating at least said portion of said surface with radiant energy. Where the radiant energy comprises a beam of photons, the emission-electrons are photo-electrons.

Normally, to produce photo-electrons, the specimen surface is irradiated with photons from a selected direction or directions.

The resolution of the magnified image at the second region can be seen to be a function of the primary energy of the emission-electrons emitted at the sample and the angular distribution of these emitted electrons. The radius of the helical orbits of the electrons so emitted sets the limit of resolution. The worst case for the resolution is to consider all electrons emitted perpendicular to the magnetic field at the sample. For a specimen in a magnetic field at 7.7 Tesla, this maximum helical radius is typically one micron for photo-electrons of 5 electron Volts (eV). If an isotropic distribution of emitted electrons is considered, the results would be more favourable leading to an effective resolvable object size (diameter at half intensity) of 1.7 microns.

The ability to produce a magnified electron image of the specimen can be used to provide spatial information of the distribution of electron yields across the surface of the specimen. For photo-electrons, spatial information would be associated with regions of different photo-electron yield on the specimen surface. For example the microscope may be used to map heavy atom rich structures in biological specimens. Concentration of iodine containing species for example can be observed.

In addition, employing electron energy analysis as used for electron spectrometry can enable the magnified image to be formed only from electrons having predetermined energy ranges. Using this energy analysis capability more information about the object may be obtained. The image described may be formed with electrons of a selected energy so, for example, mapping the surface in terms of the electron energy distribution characteristic of particular atoms or molecules. For example in the case cited, iodine containing constituents would be revealed by the groups of photo-electrons whose energy is characteristic of this atom (in the case of He 1 photo-ionisation this would be the iodine 5 p electrons).

Furthermore, it is anticipated that the energy resolution will be sufficient to detect, from shifts of the peak energies, small changes in the binding or chemical state and to produce a map of such changes.

By providing in the microscope of the present invention, means for controlling and adjusting the relative strength of the magnetic fields in the first and second regions, the magnification provided by the microscope can readily be adjusted.

Most conveniently, the magnetic field is axially symmetric but inhomogenous along the axis, said first and second regions being at spaced positions along the axis. Then said controlling and adjusting means may include means for moving the detector along the axis to locations of different relative field strength.

Said controlling and adjusting means may include means for adjusting the overall rate of variation of magnetic field strength along the axis between said first and second regions. In one example, said generating means comprises electromagnetic means having separately energisable portions for producing magnetic field at said first and second regions and said controlling and adjusting means includes means for adjusting the energising current in one portion of the electromagnet means relative to that in the other.

In one arrangement, at least said portion of the electro-magnet means for producing the field at said first region is a superconducting solenoid.

In anotheer arrangement, said generating means includes means for supplying pulses of current to the electro-magnet means to generate magnetic field pulses synchronously at said first and second regions and said electron detector means is arranged to operate in synchronism with said field pulses. In this way large pulsed fields can be generated by ordinary (non-superconducting) electro magnets, whilst avoiding the problem of joule heating in the magnet coil. It is important that the pulsed fields at all parts of the apparatus are maintained in predetermined proportions by supplying scaled and synchronised current pulses to the various coils.

Said controlling and adjusting means may include one or more members of a material having a high relative permeability located symmetrically about the axis and moveable relative to said second region. It will be appreciated that such a member or members can distort the magnetic field in the free space adjacent the member or members so as effectively to focus or diffuse the field as desired. In one example, there are a plurality of said members formed as axially aligned elongate rods.

In a preferred embodiment of the invention, the magnetic field has a third region, on the flux lines interconnecting said first and second regions, at which the field is sufficiently weak relative to the field at said first region that any kinetic energy of the electrons, when emitted, transverse to the field at the sample has been converted to kinetic energy along the flux lines when the electrons reach the third region, and means for analysing the energy along the flux lines of the electrons in the third region.

Conveniently said energy analysing means comprises means for preventing continued passage towards said second region of electrons passing through said third region having less than a predetermined energy along the flux lines. Then said means for preventing may comprise a retarding electrode in said third region.

It would be appreciated that such a retarding electrode analysing means allows all electrons above a certain energy to pass through to reach the detector. Alternative analysing means may permit only electrons haivng an energy within a relatively narrow band to pass through. Examples of such analysing means employ so called trochoidal deflection with crossed magnetic and electrostatic fields, or use pulsed retarding grids spaced apart along the field in the third region to permit passage through both grids only of electrons traversing between the grids with a predetermined time of flight. With such forms of analysing means, the detector can be made responsive only to electrons emitted in the predetermined energy band.

In a further embodiment of the invention, there is provided, positioned in said first region in front of said specimen locating means, means for preventing continued passage towards said second region of electrons emitted by said sample having less than a predetermined kinetic energy along the flux lines, whereby only electrons emitted having a relatively high proportion of their energy along the field can be transmitted. This technique can be used to improve the spatial resolution of the microscope by eliminating emitted electrons having a relatively high proportion of their energy transverse to the magnetic field. It will be appreciated that electrons with high transverse energies have the greatest orbits around the field lines thereby reducing image resolution at the detector. The use of this technique for improving resolution does of course reduce the flux of electrons flowing to the second region.

Said means for preventing in said first region may be a retarding electrode.

Said means for preventing in said first region preferably includes a further electrode in said first region at a potential relative to said retarding electrode such as to restore the forward energy along the flux lost by electrons transmitted by said retarding electrode.

The microscope may be arranged such that the field strength in said first region reduces on each side, in the field direction, of a point of maximum field strength, and then said means for locating the specimen may be arranged for locating the specimen at a selected distance, in the field direction, from said point of maximum field strength remote from said second region, whereby said point of maximum field strength acts as a magnetic mirror to reflect back electrons having a velocity at greater than a corresponding angle to the field direction.

In one embodiment, said electron detector means includes electro-magnetic deflection means arranged for selectively deflecting the electrons travelling to the detector so as to present for imaging at the detector electrons from a selected part of said stimulated surface portion of the specimen. Then, the detector may comprise a single point detector and said electro-magnetic deflection means may be arranged to provide a raster scanning of the desired electron image over said detector so that the detector provides a serial T.V.-like output video signal of said image.

Conveniently, said means for irradiating may comprise a source of vacuum ultra-violet or soft x-ray radiation and means for controlling the polarisation and/or the angle of incidence of photons from the source on the surface of the specimen.

In another arrangement the radiant energy may be a beam of neutral atoms.

In yet another arrangement, said means for stimulating may comprise means for heating the specimen to emit thermal electrons.

Examples of the present invention will now be described with reference to the accompanying drawings in which.

Figure 1:
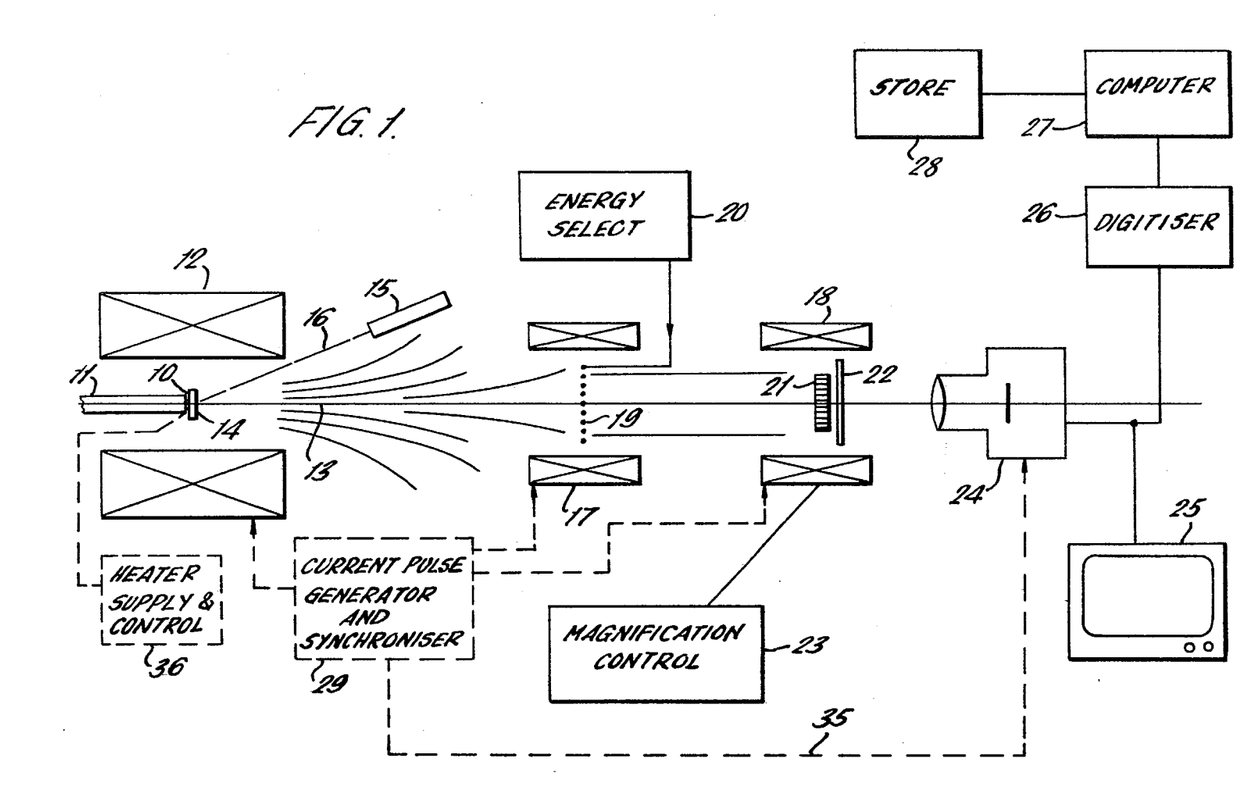
FIG. 1 is a schematic diagram illustrating an emission-electron microscope embodying the present invention.

Referring to FIG. 1, a specimen 10 for analysis and inspection is mounted on a support 11 in a region of high magnetic field produced by a solenoid 12 which may be super-conducting. The solenoid 12 is arranged to produce an axially symmetric field having an axis 13 and the specimen 10 is located by the support 11 so that a surface 14 of the specimen intersects the axis 13 transversely.

In one arrangement, a source 15 typically of vacuum ultra-violet light or of soft x-rays, is arranged to direct a beam 16 of photons towards the surface 14 of the specimen 10. The photons in the beam 16 have an energy sufficient to ionize atoms at the surface 14 of the specimen 10 so that photo-electrons are emitted from the surface.

The region surrounding the specimen 10 is maintained at a hard vacuum, by means not shown in the diagram, so photo-electrons emitted from the surface 14 can travel substantially without collisions with other particles or atoms.

As explained previously, the presence of the magnetic field from the solenoid 12 constrains electrons emitted with components of energy transverse to the magnetic field at the sample 10 to travel in spirals along the lines of flux of the field. Thus all electrons emitted from the surface 14 travel substantially parallel to the axis 13 of the magnetic field so long as the field is homogeneous within the solenoid 12.

The solenoid 12 is preferably formed to produce a magnetic field at the specimen of at least one tesla, and preferably between 5 and 20 tesla. The maximum limit to the magnetic field which can be produced is dependent on developments in the production of superconducting solenoids for use as the solenoid 12. It will be appreciated that the higher the field produced by the solenoid 12, the smaller the diameter of the spiral orbits of electrons emitted from the surface 14.

The source of ultra-violet 15, typically a helium discharge lamp, may be arranged to produce photons with energies in the range 3 to 50 electron Volts, typically 21 electron Volts. It will be understood that the greater the energy of photons in the beam 16, the greater the kinetic energy of the emitted photo-electrons, which also has the effect of increasing the diameter of the electron spiral orbits. It is desirable to keep the spiral orbits as small a possible to enhance the resolution of the microscope.

Spaced along the axis 13 of the super-conducting solenoid 12 there are further solenoids 17 and 18 one or both of which may also be superconducting. Solenoids 17 and 18 are co-axial with the solenoid 12 and arranged to control the strength of the magnetic field over respective regions along the axis 13. The solenoid 17 is arranged to provide a substantially homogeneous magnetic field over an axial region containing an energy analyser comprising a retarding electrode 19. The retarding electrode 19 is maintained by an energy select unit 20 at a selected electric potential so that only electrons travelling along parallel to the axis 13 from the specimen 10 with an axial energy greater than the potential difference between the electrode 19 and the specimen 10 can pass the electrode 19. Thus, the flux of electrons to the right hand side of the electrode 19 in FIG. 1, comprises only those electrons having an energy along the axis 13 greater than a predetermined amount dependent on the setting of the energy select unit 20.

The magnetic field between th solenoids 12 and 17 is inhomogeneous along the axis 13 so that the field within the solenoid 17 is very much weaker than the field in solenoid 12. As a result, as explained previously, nearly all the energy transverse to the magnetic field of the electrons emitted at the surface 14 of the specimen 10 is transferred to energy along the field by the time the electrons reach the region within the solenoid 17. The proportion of electrons passing the retarding electrode 10 is therefore representative of the proportion of electrons emitted from a predetermined region of the surface 14 with total kinetic energies above the preset energy determined by the unit 20.

Because the lines of magnetic flux between the solenoids 12 and 17 diverge in an axially symmetric manner, it will be appreciated that the spatial distribution of the electrons passing the electrode 19 is representative of a magnified electron image of a small axial portion of the surface 14 of the specimen 10.

The solenoid 18 provides a further region of substantially homogeneous magnetic field containing an electron detector arrangement. This may comprise a micro-channelled plate 21 in front of a fluorescent phosphor screen 22. The operation of micro-channel plates is well known and they serve in effect as electron multipliers whilst preserving the spatial distribution transverse to the electron flux. The duly multiplied electron flux from the micro-channel plate 21 then impinges upon the phosphor screen 22 to produce a light image of the electron flux distribution. It can be seen that this image on the phosphor screen 22 comprises a magnified photo-electron image of a portion of the surface 14 of the specimen 10. Alternatively the electron image may be recorded using an integrated solid state device with or without amplification by a channel plate.

Since electrons emitted from the surface 14 are constrained in the magnetic field initially to orbit around a fixed bundle of flux lines, and in due course to travel subatntially parallel to the flux lines, it can be seen that the linear magnification of the image on the phosphor screen 22 is proportional to the square root of the ratio of the magnetic field at the specimen 10 produced by the solenoid 12 to the field at the detector comprising the micro-channel plate 21 and phosphor screen 22, produced by the solenoid 18.

With a super-conducting solenoid for the solenoid 12 producing a magnetic field up to say 9 Tesla, and the field at the detector, as controlled by the solenoid 18, as small as 10 microtesla, it can be seen that magnifications in the order of a thousand times or greater can be achieved.

As also explained previously, the resolution of the electron image is dependent on the diameter of the electron orbits on emission from the surface 14, which is in turn dependent on the size of the magnetic field at the specimen 10 and the energy of the electrons emitted from the surface 14.

A magnification control unit 23 enables the magnetic field produced by the solenoid 18 to be adjusted so as to control the magnification at the phosphor screen 22. The light image produced on the phosphor screen 22 is detected by a TV camera 24 in the usual way and the video data resulting from this or other detector may be supplied for direct viewing of the image on a TV screen 25 or via a digitiser 26 for feeding to a computer 27 with a data store 28. The digitised data can then be analysed by the computer as desired.

In the described example, each of the solenoids 12, 17 and 18 are preferably super-conducting solenoids and they may be formed as a single unit provided with means to enable discrete control of the magnetic field at one region containing the specimen 10 and at least one other region containing the detector 21, 22. Separate control may also be provided over a third region containing the energy analyser 19.

The entire flight path of photo-electrons between the specimen 10 and the phosphor plate 22 must be maintained at a hard vacuum to minimise the risk of collision of electrons during the passage along the instrument.

The above described example operates with steady state magnetic fields preferably generated using a super-conducting solenoid at least for the solenoid 12. However useful results may be obtained using a permanent magnet even for generating the high field strength at the specimen 14. The field strength attainable with presently available permanent magnets is lower than with superconducting magnets, but is yet sufficient to provide an operable microscope though with lower resolution. However, the low cost of a permanent magnet may make its use desirable in some applications. The permanent magnet should produce a field with axial symmetry and the specimen may be mounted against one pole-piece.

Instead of steady state fields, pulsed fields may be produced using ordinary (non-superconducting) solenoids for each of solenoids 12, 17 and 18. Then, a current pulse generator and synchronising unit 29 may be arranged to provide synchronous pulses of energising current to each of the solenoids 12, 17 and 18. Very high pulsed fields can be generated in this way without excessive joule heating in the solenoids. Synchronising pulses are also supplied from unit 29 on line 35 to the T.V. camera 24 to ensure the image generated on the phosphor screen 22 only during the pulses is recorded by the camera.

it can be shown that with normal substantially isotropic emission of photo-electrons at the surface 14 of the specimen 10, spatial resolution of the surface 14 at the phosphor plate 22 may be in the order of one micron with a typical maximum field strength at the specimen 10 of 9 Tesla and an electron energy on emission of 5 electron Volts. However, the resolution can be improved by arranging to discriminate at the specimen 10 against those electrons emitted with relatively high proportions of their energy transverse to the magnetic field.

Figure 2:
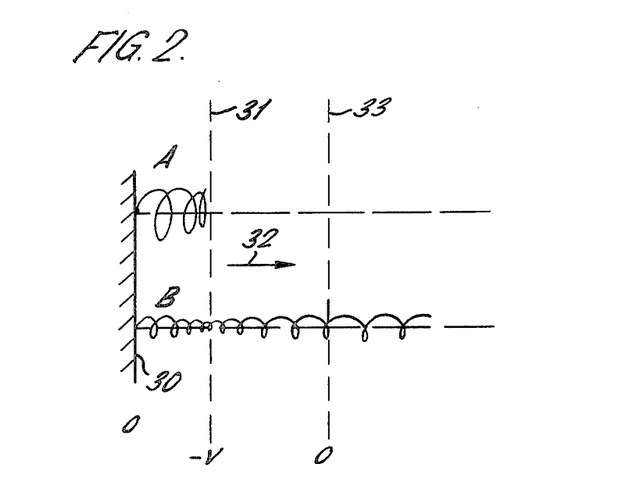
FIG. 2 illustrates diagrammatically the use of a retarding grid at the irradiated specimen to improve resolution.
Figure 3:
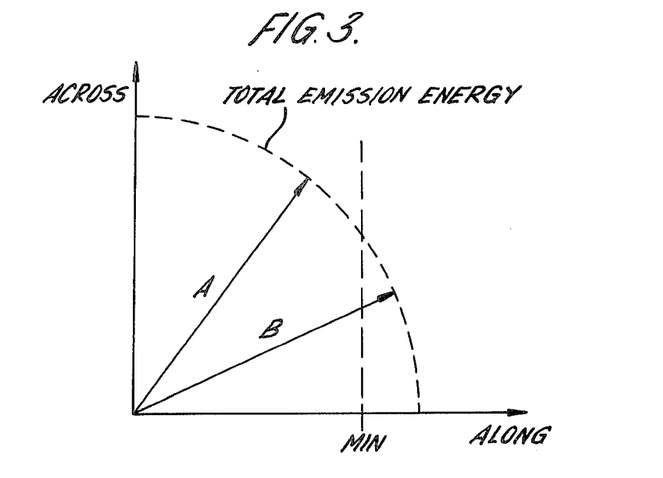
FIG. 3 is a graphical representation of the effect of the retarding grid of FIG. 2.

Referring to FIG. 2, a portion of the surface 14 of the specimen is illustrated at 30. Close in front of the surface 30 still in the region where the magnetic field at the specimen is substantially homogeneous axially, there is provided a retarding electrode 31. Means are also provided (not shown) to set the retarding electrode 31 at a predetermined negative potential relative to the specimen 10. Thus, if the specimen 10 is considered at 0 Volts, the retarding electrode 31 may be at minus-V Volts. As a result, only electrons emitted from the surface 30 having an energy in the direction of the arrow 32, i.e. along the magnetic field, greater than V electron Volts can penetrate through the electrode 31. Considering two electrons A and B emitted fom the surface 30 with the same total kinetic energy, these may be represented by the vectors A and B in the graphical representation of FIG. 3 in which the X axis represents the energy of the electron along the magnetic field and the Y axis the energy perpendicularly across the magnetic field. Electron A has a higher proportion of its energy transverse to the magnetic field and has insufficient forward energy to pass the electrode 31 represented by the vertical line MIN in FIG. 3. Electron B on the other hand has sufficient energy to pass the electrode. Since electron A has more energy transverse to the magnetic field, it travels fom the surface 30 with a helical orbit greater than that of electron B, as shown in FIG. 2. The electrode 31 therefore acts to cut out those electrons, such as electron A having relatively larger helical orbits, and therefore providing better resolution in the electron image produced.

It will be appeciated that electrons, such as electron B, which do pass the electrode 31, have, at least initially, reduced forward velocity along the magnetic field and it may be desirable to ensure that these electrons are speeded up again to their original forward energy by providing a further electrode 33 beyond the first electrode 31 and at the same potential as the specimen 10.

Figure 4:
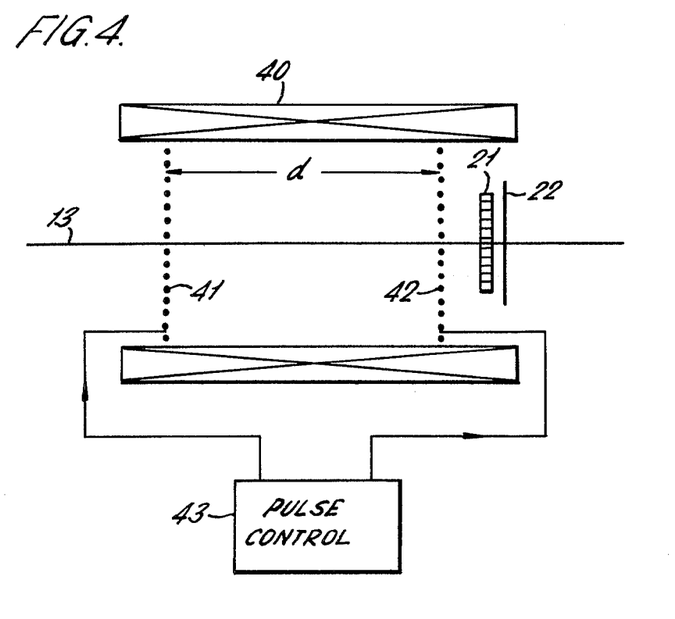
FIG. 4 illustrates a time of flight measuring arrangement for electron energy analysis.
Figure 5:
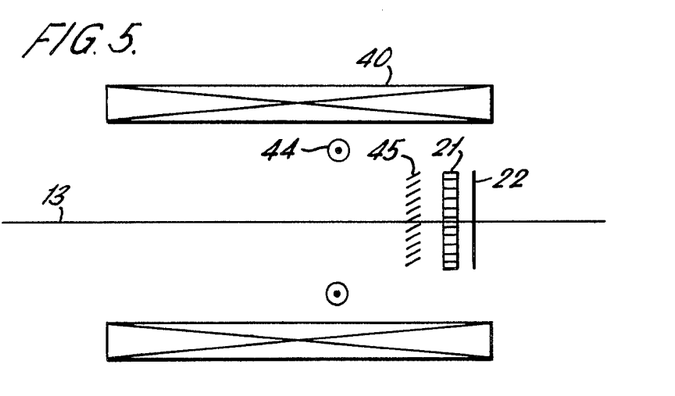
FIG. 5 illustrates a trochoidal deflection arrangement for energy analysis.

In FIG. 1, a technique of energy analysis within the region controlled by the solenoid 17 was described employing a retarding electrode 19. This technique is capable of providing only integral photo-electron spectra since all electrons having greater than the predetermined energy pass through the grid 19. FIGS. 4 and 5 illustrate two alternative techniques of producing in effect a first derivative spectral analysis whereby only electrons having energies within a narrow band are permitted to pass through the detector.

FIG. 4 illustrates a time of flight technique. In FIG. 4, the two solenoids 17 and 18 of FIG. 1 are in effect combined in a solenoid 40 providing an extended region along the axis 13 of substantially homogeneous magnetic field. The magnetic field within the solenoid 40 is arranged to be sufficiently weak relative to that at the specimen 10 to provide the desired magnification and also to ensure substantially all electron energy has been converted to forward energy.

Spaced apart by a distance d in front of the detector there are two retarding electrodes 41 and 42. In one arrangement, electroes 41 and 42 are normally maintained at a sufficient negative voltage relative to the specimen 10 to prevent any photo-electrons penetrating. A pulse control unit 43 then provides positive going voltage pulses to the electrodes 41 and 42 with the pulse supplied to the electrode 42 following that supplied to the electrode 41 by a predetermined time delay t. If the voltage pulses are such as to permit electrons travelling along the axis 13 to pass through either of the electrodes only during the duration of the pulse supplied to the electrode it can be seen that only those electrons having a predetermined flight time for the distance d between the grids equal to the time delay t will pass both electrodes 41 and 42 and arrive at the detector. Since the flight time is dependent on the speed of the electrons which is in turn dependent on their energy, varying the time delay t can effectively tune the analyser to pass only electrons having a predetermined energy.

The alternative arrangement illustrated in FIG. 5, employs trochoidal deflection of the electrons. A similar extended solenoid 40 is employed to encompass both the detector and the analyser regions. In the analyser region means are provided to produce an electric field transverse to the magnetic field, for example out of the paper as illustrated at 44 in FIG. 5. It is well known that electrons travelling in perpendicular magnetic and electric fields describe a complex motion resulting in an average displacement at right angles to the electric field, upwards in FIG. 5.

By providing a grid of chevron plates 45, only electrons having a predetermined angle to the axis 13 are passed to the detector. Clearly, with a given electric field (over a predetermined distance) and magnetic field, the angle of the electron path is dependent on the electron energy so that the chevron plates 45 operate to pass only those electrons having a predetermined energy. The energy may be selected by adjusting either the electric field 44 or the magnetic field produced by the solenoid 40 or alternaltively by adjusting the angle or position in the region of electric field of the plates 45.

Figure 6:
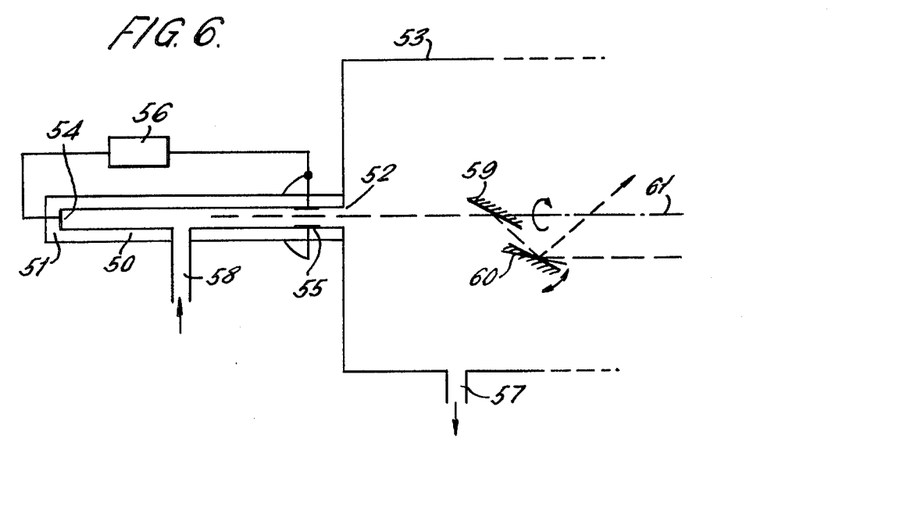
FIG. 6 illustrates a windowless ultra-violet source with adjustable polariser and direction selector.

FIG. 6 illustrates diagrammatically a preferred arrangement for directing photons from the source 15 to the radiated specimen. The source may comprise a helium discharge tube providing ultra-violet radiation. Ultra-violet radiation is absorbed by the glass or other material used to contain the gas of the gas discharge. Thus, in order to maximise the photon flux or intensity from the gas discharge it is desirable to use a windowless arrangement. A capillary tube 50 may be provided having one closed end 51 and the opposite end open, via a small pin hole 52 to the interior of a chamber 53 forming the vacuum chamber of the photo-electron microscope. As mentioned before the specimen 10 and all regions of the microscope in which the photo-electrons are intended to travel, and thus the chamber 53, should be at a hard vacuum. On the other hand a certain density of gas atoms is required to provide the gas discharge generating ultra-violet radiation. An anode 54 and cathode 55 are provided at opposite ends of the capillary 50 and supplied from a voltage source 56 to produce the desired discharge. It will be appreciated that gas atoms in the capillary 50 will tend to escape through the pin hole aperture 52 into the chamber 53. Accordingly, pumping means (not shown) are provided to pump continuously from the chamber 53 via an aperture 57 to remove atoms leaking into the chamber. Since atoms in the capillary 50 are continually being lost through the opening 52, these atoms must be replenished, to maintain the discharge, through an inlet 58. With this arrangement, ultra-violet radiation generated by the discharge can pass directly into the chamber 53 through the opening 52 without being transmitted through a window.

In the chamber 53, a mirror arrangement is provided to direct the beam of ultra-violet radiation as desired at the surface 14 of the speciment 10. The mirror arrangement may comprise two mirrors 59 and 60 set so that the radiation from the discharge is reflected in the two mirrors before being directed at the specimen 10. The mirror 59 may be set at an angle to the radiation emitted from the pin hole opening 52 such that the reflected radiation from the mirror 59 is substantially polarised. Means may be provided also to rotate the mirror 60 about an axis in the plane of the mirror and perpendicular to the paper in FIG. 6 so as to direct the radiation from the mirror 60 as desired. Furthermore, both mirrors 59 and 60 may be rotatable together about an axis 61 to enable the angle of polarisation of the emerging radiation relative to the specimen to be set as required. With this arrangement both the polarisation angle and the angle of incidence of the radiation in the beam 16 directed at the surface 14 of the speciment 10 can be adjusted.

It can be seen, that the photo-electron microscope described above can be used to provide a magnified image of a porion of the surface 14 of the speciment 10. This image can be representative of the spatial distribution of the total electron flux from the various surface regions and it is also possible and advantageous to produce an image representative to the flux of electrons within a predetermined energy band. Substantially all electrons emitted from the part of the surface forming the image can arrive at the detector. Only a very low energy quantum is used to excite the surface 14 of the specimen 10 so that minimal damage is done even to biological specimens. Further, the images can be employed to determine the distribution of materials of different bonding energies or chemical states across the surface. For example the microscope may be used to map heavy atom rich structures in biological specimens. Concentration of iodine containing species, for example, can readily be observed.

Further, since there are no lenses or focusing optics in the microscope, there is no depth of field limitation. The thickness of the surface layer of the specimen which contributes to the image depends on the incident photon wavelength and on the electron escape depth and lies approximately in the range $2 \times 10^{-10}$ meters to $2 \times 10^{-8}$ meters.

In the above description of examples of microscope embodying the present invention, consideration has been given primarily to an arrangement employing a beam of photons to irradiate the surface of the speciment so as to emit photo-electrons, which are subsequently imaged. This particular embodiment has been referred to as a "photo-electron microscope".

More generally, the invention is applicable to other forms of emission-electrons.

For example, the surface of the specimen may be excited or stimulated to emit electrons by a neutral atom beam. Such neutral atom beams are used for various purposes in the technology of surface devices. When a speciment is irradiated with neutral atoms, the surface of the specimem emits electrons and these emitted electrons could be imaged in the same way as photo-electrons using the above described techniques. The above described imaging process could be carried out on electrons given off by a specimen which is being irradiated with a neutral atom beam for some other investigative purpose. Commercial devices for producing neutral atom beams are readily available.

The specimen may be stimulated to emit electrons by other means. For example, the specimen may be heated to emit thermal electrons. Many materials, when heated to a suitably high temperature, emit electrons spontaneously and these thermal electrons can be used in the above described apparatus to form an image in the same way as for photo-electrons. For example, the specimen may comprise the cathode of an electron tube and the image produced by the microscope could then provide a means of assessing the quality of the cathode.

When the apparatus illustrated in FIG. 1 is used to image thermal electrons emitted, for example, by a heated cathode, a heater supply and control unit 36 may be provided supplying heater current to a heating element associated with the specimen to be heated, e.g. the cathode.

The apparatus described may also be used to image Auger electrons. It is well known that atoms which are highly excited by x-ray photons, or an electron beam, or by other methods can suffer internal transitions which result in the emission of an electron whose energy is characteristic of the atom itself and is independent of the means of excitation. Such electrons are commonly called Auger electrons and the process is described in, for example, "Photo-electron and Auger Spectroscopy", by T. A. Carlson, published by Plenum Press 1975. One use of such Auger electrons would be to form an image using the above described apparatus of the distribution of a selected element in the specimen surface.

Figure 7:
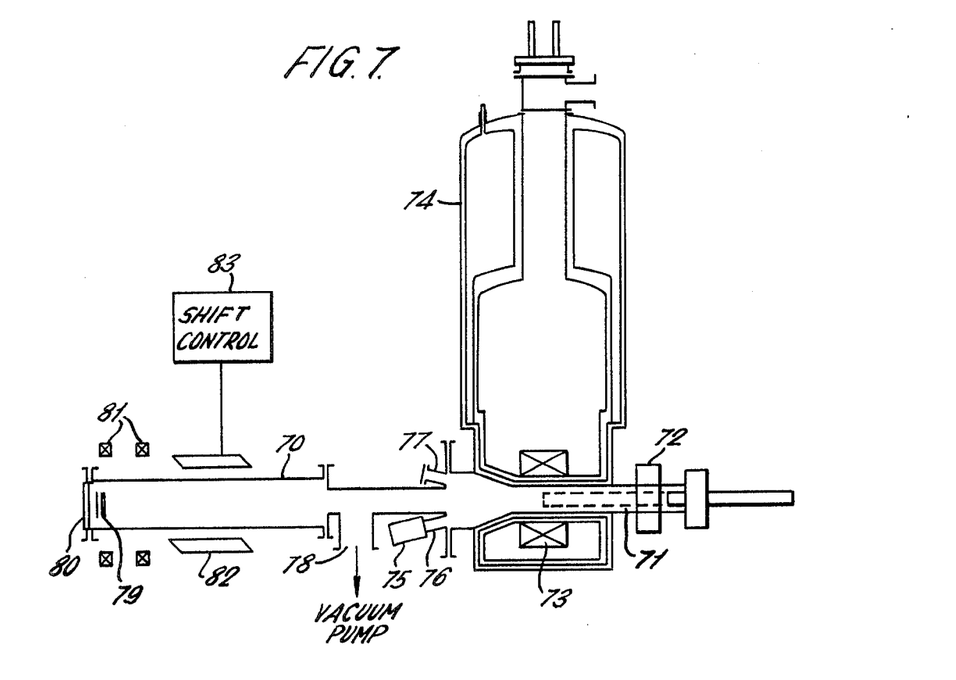
FIG. 7 is a schematic diagram of a prototype form of microscope employing photo-electrons.

FIG. 7 illustrates in diagrammatic form a prototype microscope apparatus embodying the invention. In FIG. 7, electrons to be imaged are emitted into an evacuated chamber 70 by a specimen mount at the end of a mounting rod 71 located at one end of the chamber 70. The mounting rod 71 may permit the specimen to be inserted into the chamber 70 through a gate valve 72 so that the specimen can be located in the region of a strong magnetic field generated by a superconducting solenoid 73 cooled in a liquid helium cryostat 74. The specimen is irradiated by hard ultra-violet photons generated in a helium lamp 75. The photons enter the chamber 70 via a port 76. The chamber 70 is formed with a further spare port 77. the chamber 70 is evacuated via an exhaust port 78 by a vacuum pump (not shown). Electrons emitted by the specimen and travelling along the chamber 70 impinge upon the detector arrangement 79 comprising a channel plate in front of a phosphor screen. The electron image formed on the phosphor screen can be viewed through a view port 80 in the end of the chamber 70. The magnetic field at the detector is controlled at a desired relatively low field strength by coils 81. The apparatus shown in FIG. 7 operates essentially in the same manner as the apparatus of FIG. 1 and no further description is considered to be necessary.

However, the apparatus of FIG. 7 has additionally image shift coils 82. These image shift coils are arranged, when energised, to produce a component of magnetic field transverse to the magnetic field direction along the chamber 70. Thus, the effect of the magnetic field component generated by the shift coils 82 is to shift the magnetic flux lines transversely across the length of the chamber 70 and thereby to produce a corresponding shift in the electron image at the detector arrangement 79. A shift control unit 83 is arranged to control the current supplied to the shift coils 82 to effect a desired amount of transverse shift of the electron image. Conveniently, two sets of shift coils are provided enabling the image to be shifted as desired in both X and Y directions.

In one arrangement, the shift control unit 83 is arranged to provide saw tooth energising current wave forms to the orthogonal shift coils such as to produce a raster scanning of the image. Then, the detector 79 may be replaced by a single point electron detector providing an electrical signal output on a single line. It can be seen then that the output of the single point detector can comprise a serial T.V.-like video signal making up a T.V. raster scan picture of the electron image. This arrangement obviates the need for a separate television camera for recording the electron image.

In the above described examples of the invention, it has been said to be desirable to locate the specimen in a region of high field strengths. In order to obtain maximum spatial resolution in the electron image produced by the apparatus, the field strength at the specimen should be maximised. However, in certain application, it may be desirable to arrange for the field strengths in the region of the specimen to fall away on opposite sides, in the axial direction, of a point of maximum field strength. In such an arrangement, the specimen may desirably be located slightly behind the point of maximum field strength; i.e. on the opposite side of the maximum point from the detector.

It is well known that electrons can be reflected from a region of increasing magnetic field. This is known as the magnetic mirror effect. This occurs because, within the adiabatic approximation, the quantity $(1/B)\sin^2\theta$ is conserved, where B is the magnetic field strength and $\theta$ is the angle between the magnetic field and the electron velocity. As B increases so $\theta$ is required to increase, but the value $\sin\theta$ cannot exceed 1, so the electron simply turns back, i.e. is reflected. In the above described example of the present invention, it is apparent that an electron emitted from a specimen in a field $B_s$, which has to pass a region of greater field $B_{max}$ before reaching a detector, will only reach the detector if it is emitted at an angle $\theta_s$ (to the field $B_s$) which is smaller than a critical value $\theta_c$ given by $$(1/B_s)\sin^2\theta_c = (1/B_{max})$$

Thus, by mounting the specimen slightly behind a point of maximum field strength, there is provided an arrangement which reflects electrons not emitted into a forward looking cone of a predetermined angle. Only electrons emitted within the defined solid angle can pass the magnetic mirror. This can be useful in certain investigations of solid surfaces. It will be understood, however, that displacement of the specimen behind the point of maximum magnetic field reduces the spatial resolution of the electron image.

I claim:

1. An emission-electron microscope comprising:

means for generating a magnetic field having a first region at which the field is relatively strong and a second region at which the field is relatively weak and which is interconnected by lines of flux with the first region, means for locating a specimen to be examined in said first region, the specimen being selected or arranged in use such that electrons are emitted by at least a portion of a surface of said specimen extending in said first region at an angle to said field, said magnetic field generating means being arranged so that the field in said first region is sufficiently strong that electrons emitted by the specimen at angles to the magnetic field are constrained by the field to spiral around the lines of flux of the field, electron detector means including a detector located in said second region, said detector means being arranged to provide an indication of the spatial distribution transversely of the field in said second region of electrons emitted by the specimen and travelling to said second region, thereby to provide a magnified emission-electron image of at least part of said surface portion of the specimen, means for controlling and adjusting the relative strengths of the magnetic fields in the first and second regions to effect adjustment of said image magnification, and resolution enhancement means for enhancing the resolution of said magnified image, including means in said first region, in front of said specimen locating means, for preventing continued passage towards said second region of emitted electrons with less than a predetermined kinetic energy along the flux lines.

2. An emission-electron microscope as claimed in claim 1 wherein the field in said first region is homogeneous in the field direction and said means for preventing in said first region is a retarding electrode.

3. An emission-electron microscope as claimed in claim 2 wherein said means for preventing in said first region includes a further electrode in said first region at a potential relative to said retarding electrode such as to restore the forward kinetic energy along the flux lines lost by the electrons which are transmitted by said retarding electrode.

4. An emission-electron microscope as claimed in claim 1 wherein the field strength in said first region reduces on each side, in the field direction, from a point of maximum field strength, and said means for locating the specimen is arranged for locating the specimen at a selected distance, in the field direcion, from said point of maximum field strength external to said second region, whereby said point of maximum field strength acts as a magnetic mirror to reflect back said electrons having less than said predetermined kinetic energy along the flux lines.

* * * * *